(12) United States Patent
Ishiwata

(10) Patent No.: US 9,620,554 B2
(45) Date of Patent: *Apr. 11, 2017

(54) IMAGE PICKUP UNIT AND ELECTRONIC APPARATUS

(71) Applicant: SONY CORPORATION, Tokyo (JP)

(72) Inventor: Hiroaki Ishiwata, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/831,642

(22) Filed: Aug. 20, 2015

(65) Prior Publication Data

US 2016/0049440 A1 Feb. 18, 2016

Related U.S. Application Data

(63) Continuation of application No. 14/385,805, filed as application No. PCT/JP2013/054697 on Feb. 25, 2013, now Pat. No. 9,147,705.

(30) Foreign Application Priority Data

Apr. 2, 2012 (JP) ................................ 2012-084001

(51) Int. Cl.
 *H01L 27/148* (2006.01)
 *H01L 27/146* (2006.01)
(52) U.S. Cl.
 CPC .... *H01L 27/14645* (2013.01); *H01L 27/1464* (2013.01); *H01L 27/14603* (2013.01); *H01L 27/14609* (2013.01); *H01L 27/14612* (2013.01); *H01L 27/14627* (2013.01); *H01L 27/14636* (2013.01); *H01L 27/14638* (2013.01); *H01L 27/14641* (2013.01); *H01L 27/14647* (2013.01)

(58) Field of Classification Search
 CPC ......... H01L 27/14645; H01L 27/14627; H01L 27/14641; H01L 27/14603; H01L 27/14636; H01L 27/14612
 USPC ........................................................ 257/233
 See application file for complete search history.

(56) References Cited

U.S. PATENT DOCUMENTS 9,147,705 B2 * 9/2015 Ishiwata ........... H01L 27/14638
2009/0303371 A1 * 12/2009 Watanabe ......... H01L 27/14603
 348/311

(Continued)

FOREIGN PATENT DOCUMENTS

| JP | 2006-261411 A | 9/2006 |
|---|---|---|
| JP | 2008-172580 A | 7/2008 |
| JP | 2009-295937 A | 12/2009 |

(Continued)

OTHER PUBLICATIONS

Office Action for CN Patent Application No. 201380016426.X CNOA, issued on Jul. 19, 2016, 6 pages of Office Action and 8 pages of English translation.

*Primary Examiner* — Trung Q Dang
(74) *Attorney, Agent, or Firm* — Chip Law Group

(57) ABSTRACT

A solid-state image pickup unit includes substrate; a red pixel including a red charge storage section; a blue pixel including a blue charge storage section; and a green pixel including a plurality of green charge storage sections, the red charge storage section and the blue charge storage section being provided in the substrate. Then, the plurality of green charge storage sections are arranged in the substrate along a thickness direction of the substrate.

18 Claims, 6 Drawing Sheets

(56) References Cited

U.S. PATENT DOCUMENTS

2011/0068251 A1 3/2011 Narui
2011/0156104 A1* 6/2011 Yamaguchi ....... H01L 27/14603
257/222

FOREIGN PATENT DOCUMENTS

| JP | 2010-041261 A | 2/2010 |
| JP | 2010-114323 A | 5/2010 |
| JP | 2011-044544 A | 3/2011 |
| JP | 2011-061767 A | 3/2011 |
| JP | 2011-138927 A | 7/2011 |
| JP | 2011-159757 A | 8/2011 |

* cited by examiner

IMAGE PICKUP UNIT AND ELECTRONIC APPARATUS

CROSS-REFERENCE TO RELATED APPLICATIONS

This application is a continuation of U.S. patent application Ser. No. 14/385,805, filed Sep. 17, 2014, which is a national stage application under 35 U.S.C. 371 and claims the benefit of PCT Application No. PCT/JP2013/054697, having an international filing date of Feb. 25, 2013, which designated the United States, which claims priority to Japanese Patent Application No. JP 2012-084001, filed Apr. 2, 2012, the entire disclosures of which are hereby incorporated herein by reference.

TECHNICAL FIELD

The present disclosure relates to a solid-state image pickup unit and an electronic apparatus including the same.

BACKGROUND ART

In recent years, as solid-state image pickup units, CMOS (Complementary Metal-Oxide-Semiconductor) image sensors are used for various applications as an alternative to CCDs (Charge-Coupled Devices). For example, the number of cases where the CMOS image sensor is used as a solid-state image pickup unit mounted in a digital still camera, a digital camcorder, a surveillance camera, a camera for broadcasting, movie making, or business use, or a camera built in a cellular phone has increased. This is caused by a remarkable improvement in image quality of the CMOS image sensors in addition to advantages of higher-speed shooting (higher frame rate), lower power consumption, and the like, compared to the CCDs. Moreover, the CMOS image sensors have an advantage in that a pixel section in which unit pixels (hereinafter simply referred to as "pixels") are arranged in an array and a peripheral circuit section are allowed to be fabricated on a same semiconductor substrate.

In the CMOS image sensors, a typical pixel includes a photodiode (hereinafter referred to as "PD") configuring a photoelectric conversion section (a charge storage section) and a floating diffusion region section (hereinafter referred to as "FD region section") that converts a photo-charge (hereinafter simply referred to as "charge") generated in the PD into a voltage. The pixel further includes various pixel transistors to read a charge stored in the PD.

In recent years, four-transistor pixels each including a transfer transistor, an amplification transistor, a reset transistor, and a selection transistor are frequently used. However, three-transistor pixels not including the selection transistor may be used for miniaturization of pixels.

It is to be noted that the transfer transistor is a pixel transistor that transfers a charge stored in the PD to the FD region section, and the amplification transistor is a pixel transistor that amplifies a voltage signal converted by the FD region section. Moreover, the reset transistor is a pixel transistor that resets a potential of the FD region section, and the selection transistor is a pixel transistor that selects a pixel from which a charge is to be read.

In a digital still camera or the like including the CMOS image sensor with the above-described configuration, demands for an increase in pixel number and a reduction in enclosure size are met by reducing a cell size of the pixel. As an effective technique of reducing the cell size of the pixel, for example, a pixel sharing technology is used. In the pixel sharing technology, pixel transistors except for the transfer transistor and the FD region section are shared among a predetermined number of pixels (for example, two pixels, four pixels, or the like), and the transfer transistor and the PD are provided to each of the pixels.

For example, in a case of sharing between two pixels, the pixel transistors except for the transfer transistor and the FD region section are shared between the two pixels, and the transfer transistor and the PD are provided to each of the pixels. In this case, five pixel transistors (the amplification transistor, the reset transistor, the selection transistor, and the two transfer transistors) in total are provided to the two sharing pixels. In a case where the pixel sharing technology is not used, four pixel transistors are necessary for each pixel; however, in a case where the pixel transistors are shared between two pixels in the above-described manner, the number of pixel transistors per pixel is 2.5 (=5/2). Therefore, in the case where the pixel sharing technology is used, a formation area of the pixel transistors is allowed to be reduced, and the cell size of the pixel is allowed to be reduced accordingly. Moreover, in this case, a formation area of the PD is allowed to be increased by a reduction in the formation area of the pixel transistors.

Moreover, in the digital still camera or the like including the CMOS image sensor with the above-described configuration, to allow an image to be shot with higher image quality in an environment in which shooting conditions are poor, for example, a dark environment, an improvement in sensitivity is in increasing demand. To meet this demand, a back side illumination (BSI) type CMOS image sensor in which light is incident from a surface (a back surface) opposite to a front surface where a pixel transistor, wiring, and the like are formed of a silicon substrate is proposed. It is to be noted that a CMOS image sensor in which light is incident from a front surface where a pixel transistor, wiring, and the like are formed of a silicon substrate is referred to as "front side illumination (FSI) type CMOS image sensor". In the back side illumination type CMOS image sensor, light is incident on the PD not through formation layers of a pixel transistor, wiring, and the like; therefore, vignetting of incident light in the pixel transistor, the wiring, and the like is allowed to be prevented. As a result, in the back side illumination type COMS image sensor, effects such as an improvement in sensitivity and an improvement in shading characteristics are obtained.

Incidentally, in a typical CMOS image sensor, it is known that a depth (hereinafter referred to as "photoelectric conversion depth") from a light incident surface where photoelectric conversion is performed on incident light in a silicon substrate where light is incident differs depending on a wavelength of incident light. More specifically, it is known that the photoelectric conversion depth in the silicon substrate increases in order of blue light, green light, and red light. In other words, the photoelectric conversion depth for blue light in the silicon substrate is smaller than each of the photoelectric conversion depths for green light and red light.

There is proposed a back side illumination type CMOS image sensor using the above-described difference in photoelectric conversion depth among respective colors and using the pixel sharing technology. Moreover, in the CMOS image sensor with such a configuration, various layout technologies of a shared pixel transistor are proposed (for example, refer to PTL 1).

In PTL 1, there is proposed a technology in which a pixel transistor shared among pixels for blue, green, and red (hereinafter referred to as "blue pixel", "green pixel", and "red pixel", respectively) is selectively arranged in a formation region of the blue pixel on a surface of a silicon substrate. The photoelectric conversion depth in the blue pixel (a PD formation position) is shallow from a light incident surface (a back surface); therefore, even if the shared pixel transistor is selectively arranged in the formation region of the blue pixel as with PTL 1, a photoelectric conversion action in the blue pixel is not adversely affected.

Therefore, in such a configuration in PTL 1, it is not necessary to arrange, in formation regions of the green pixel and the red pixel, the pixel transistor shared among the blue pixel, the green pixel, and the red pixel, and an area of the PD that performs a photoelectric conversion operation is allowed to be increased accordingly. In other words, in PTL 1, the area of the PD, an saturation signal amount, sensitivity, and the like are increased by allowing sharing pixels to have the above-described configuration, and miniaturization of pixels and single-chip color solid-state image pickup with high sensitivity and low noise are allowed to be achieved accordingly.

CITATION LIST

Patent Literature

[PTL 1] Japanese Unexamined Patent Application Publication No. 2008-172580

SUMMARY OF INVENTION

Incidentally, it is generally known that, in a silicon substrate, photoelectric conversion sensitivity (photoelectric conversion efficiency) to a light component with a green wavelength (hereinafter referred to as "green light") is higher than those of a light component with a blue wavelength (hereinafter referred to as "blue light") and a light component with a red wavelength (hereinafter referred to as "red light"). Therefore, in this technical field, in consideration of such a difference in sensitivity among pixels, it is desirable to develop solid-state image pickup units with a configuration enabling each pixel to obtain optimum pixel characteristics.

Therefore, it is desirable to provide a solid-state image pickup unit with a configuration enabling each pixel to obtain favorable pixel characteristics, based on sensitivity of a pixel of each color, and an electronic apparatus including the same.

To solve the above-described issue, a solid-state image pickup unit according to an embodiment of the present disclosure includes: a substrate, a red pixel, a blue pixel, and a green pixel, and the respective pixels have the following respective configurations. The red pixel includes a red charge storage section that is provided in the substrate and holds a charge obtained by performing photoelectric conversion on a light component with a red wavelength. The blue pixel includes a blue charge storage section that is provided in the substrate and holds a charge obtained by performing photoelectric conversion on a light component with a blue wavelength. Then, the green pixel includes a plurality of green charge storage sections that hold a charge obtained by performing photoelectric conversion on a light component with a green wavelength, and the plurality of green charge storage sections are arranged in the substrate along a thickness direction of the substrate.

Moreover, an electronic apparatus according to an embodiment of the present disclosure is configured to include the solid-state image pickup unit of the above-described present disclosure, and a signal processing circuit that performs predetermined processing on an output signal from the solid-state image pickup unit.

In the solid-state image pickup unit according to the embodiment of the present disclosure, the plurality of green charge storage sections are provided to the green pixel so as to allow a saturation charge amount (a saturation signal amount) of the green pixel to be larger than each of a saturation charge amount of the red pixel and a saturation charge amount of the blue pixel, thereby effectively using high-sensitivity characteristics of the green pixel.

As described above, in the solid-state image pickup unit according to the embodiment of the present disclosure, the saturation charge amount of the green pixel is allowed to be larger than a saturation charge amount of a pixel of another color, and full advantage is allowed to be taken of high sensitivity characteristic of the green pixel. Therefore, according to the present disclosure, favorable pixel characteristics are allowed to be obtained in each pixel, based on sensitivity of a pixel of each color.

BRIEF DESCRIPTION OF DIAGRAMS

DESCRIPTION OF EMBODIMENTS

Examples of solid-state image pickup units according to some embodiments of the present disclosure and an electronic apparatus including the same will be described below referring to the accompanying drawings in the following order. However, the present disclosure is not limited to the following examples.

1. First Embodiment: Back Side Illumination Type Solid-state Image Pickup Unit
2. Second Embodiment: Front Side Illumination Type Solid-state Image Pickup Unit
3. Various Modification Examples
4. Configuration Example of Electronic Apparatus (Application Example)

(1. First Embodiment)

First, before describing a configuration of a solid-state image pickup unit according to a first embodiment of the present disclosure, a brief description will be given of an influence of a difference between sensitivity of a green pixel and sensitivity of a blue pixel and a red pixel that may be exerted on image pickup performance of a solid-state image pickup unit.

Figure 1:
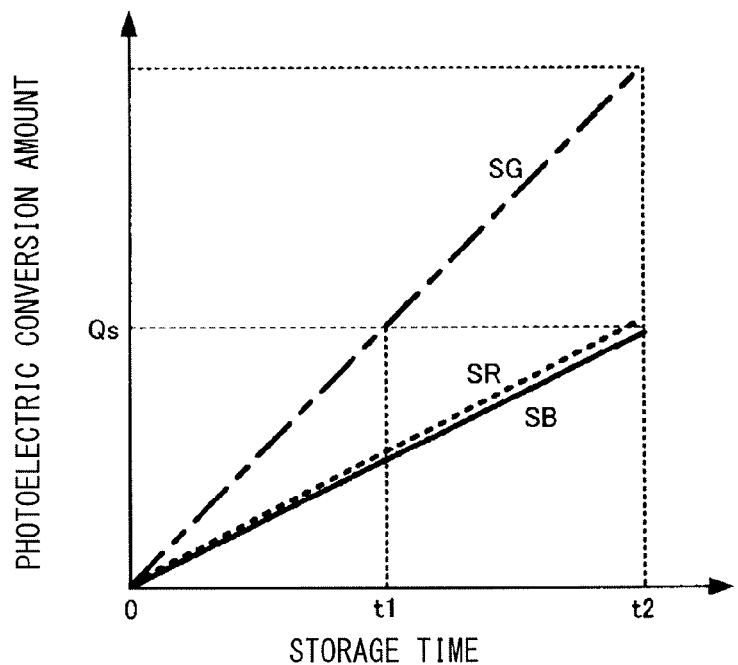
FIG. 1 is a diagram illustrating sensitivity characteristics of a red pixel, a blue pixel, and a green pixel.

FIG. 1 illustrates sensitivity characteristics of the green pixel, the blue pixel, and the red pixel. It is to be noted that a horizontal axis and a vertical axis in the sensitivity characteristics of respective pixels illustrated in FIG. 1 indicate charge storage time and a photoelectric conversion amount, respectively. Moreover, a characteristic (SB) represented by a solid line in FIG. 1 is the sensitivity characteristic of the blue pixel, a characteristic (SR) represented by a dotted line is the sensitivity characteristic of the red pixel, and a characteristic (SG) represented by an alternate long and short dash line is the sensitivity characteristic of the green pixel. Further, in an example illustrated in FIG. 1, it is assumed that saturation charge amounts Qs of respective pixels are equal to one other.

It is generally known that a value of sensitivity (photoelectric conversion efficiency) of the blue pixel is substantially equal to that of red pixel, and sensitivity (light conversion efficiency) of the green pixel is about twice as high as each of those of the blue pixel and the red pixel. Therefore, a slope of the sensitivity characteristic SG of the green pixel illustrated in FIG. 1 is about twice as large as a slope of each of the sensitivity characteristics of the blue pixel and the red pixel. As a result, as illustrated in FIG. 1, a charge amount stored in the green pixel (a charge amount to be subjected to photoelectric conversion) reaches a saturation charge amount Qs at a time t1 (about ½ of a time t2) shorter than the time t2 at which each of charge amounts stored in the blue pixel and the red pixel reaches the saturation charge amount Qs.

Therefore, in a case where an exposure time is, for example, t2, a charge subjected to photoelectric conversion in the green pixel flows from the green pixel in a period from the time t1 to the time t2, and the flowing charge is discharged to outside. In this case, the charge subjected to photoelectric conversion in the green pixel in the period from the time t1 to the time t2 is a wasted charge; therefore, full advantage is not taken of high sensitivity characteristic of the green pixel. Further, since an SN ratio is typically improved with an increase in sensitivity, in terms of the SN ratio, the high sensitivity characteristic of the green pixel is not effectively used under the above-described condition.

Therefore, in the present disclosure, there is proposed a solid-state image pickup unit with a configuration capable of taking full advantage of the above-described high sensitivity characteristic of the green pixel and capable of obtaining image pickup characteristics having a favorable SN ratio.

[Entire Configuration of Solid-State Image Pickup Unit]

Figure 2:
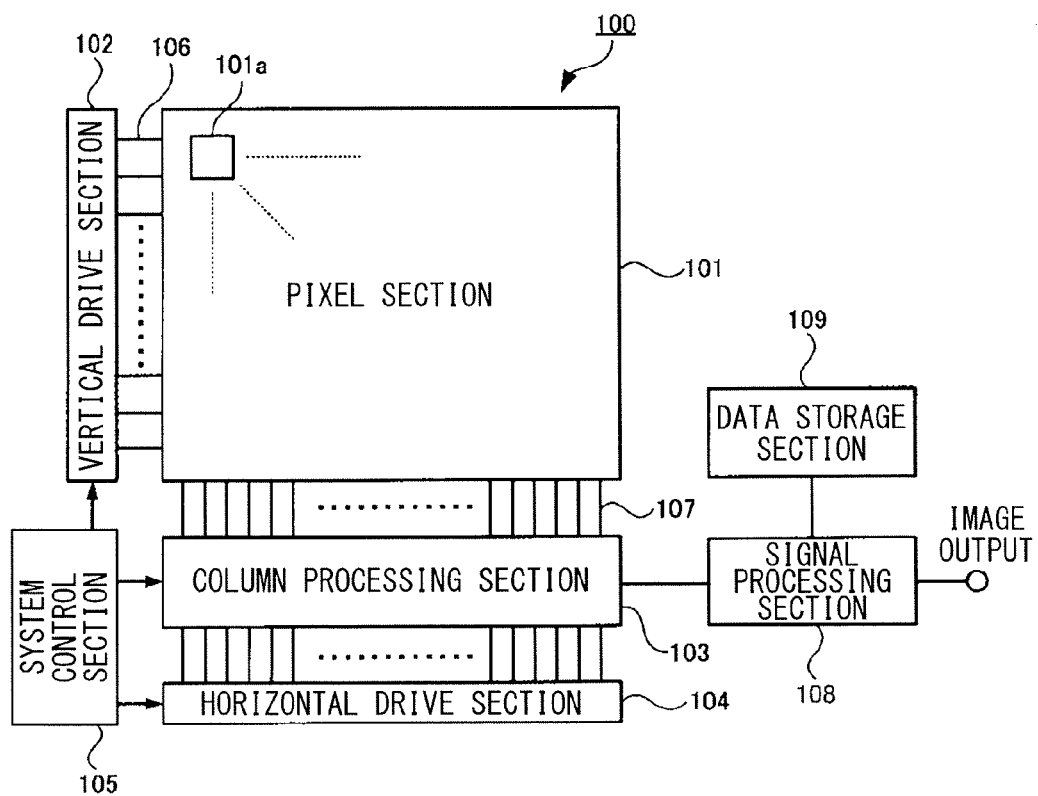
FIG. 2 is a schematic block diagram of a CMOS image sensor according to a first embodiment of the present disclosure.

FIG. 2 illustrates a schematic block configuration of a solid-state image pickup unit according to a first embodiment of the present disclosure. It is to be noted that, in this embodiment, as the solid-state image pickup unit, a back side illumination type CMOS image sensor will be described as an example.

A CMOS image sensor 100 includes a pixel section 101, a vertical drive section 102, a column processing section 103, a horizontal drive section 104, and a system control section 105. It is to be noted that the pixel section 101, the vertical drive section 102, the column processing section 103, the horizontal drive section 104, and the system control section 105 are formed on one semiconductor substrate (silicon substrate) that is not illustrated in FIG. 2.

The CMOS image sensor 100 further includes a signal processing section 108 and a data storage section 109. It is to be noted that, in this embodiment, the signal processing section 108 and the data storage section 109 may be configured of an external signal processing section that is provided to a substrate different from the CMOS image sensor 100, and performs processing by, for example, a DSP (Digital Signal Processor) or software. Moreover, the signal processing section 108 and the data storage section 109 may be mounted on, for example, the same semiconductor substrate as the semiconductor substrate where the pixel section 101 and the like are formed.

The pixel section 101 includes a plurality of pixels 101a two-dimensionally arranged in a matrix form. It is to be noted that, in this embodiment, each of the pixels 101a is configured of one of a red pixel, a green pixel, and a blue pixel, and the red pixels, the green pixels, and the blue pixels are arranged in a predetermined arrangement (for example, a Bayer arrangement or the like).

Moreover, a charge storage section that holds a charge in an amount corresponding to an incident light amount of a corresponding wavelength component is provided to each of the pixels 101a of respective colors. Further, in this embodiment, an example in which pixel transistors (an amplification transistor, a reset transistor, and a selection transistor) other than a transfer transistor are shared among a plurality of pixels 101a will be described. It is to be noted that a unit region section (hereinafter referring to as "sharing pixel unit section") shared among the pixels 101a and a configuration of each pixel 101a will be described in detail later.

The pixel section 101 further includes a pixel drive line 106 formed along a row direction (a horizontal direction in FIG. 2) for each of rows of a plurality of sharing pixel unit sections (sharing pixel unit sections 110 illustrated in FIGS. 3 and 4 that will be described later) two-dimensionally arranged in a matrix form. Moreover, the pixel section 101 includes a vertical signal line 107 formed along a column direction (a vertical direction in FIG. 2) for each of columns of the plurality of sharing pixel unit sections. It is to be noted that each pixel drive line 106 is connected to the sharing pixel unit sections belonging to a corresponding row, and each vertical signal line 107 is connected to the sharing pixel unit sections belonging to a corresponding column.

Moreover, an end of the pixel drive line 106 is connected to an output end of a row corresponding to that pixel drive line 106 of the pixel drive section 102, and an end of the vertical signal line 107 is connected to an input end of a column corresponding to that vertical signal line 107 of the column processing section 103. It is to be noted that, in FIG. 2, for simplification of description, the pixel drive line 106 for each row is represented by one signal line; however, as will be described later, a plurality of respective signal lines that drive a plurality of respective pixel transistors configuring the sharing pixel unit section are typically provided for each row.

The vertical drive section 102 may be configured of, for example, circuit devices such as a shift register and an address decoder, and outputs various drive signals to each of the pixels 101a (the sharing pixel unit sections) of the pixel section 101 to drive each of the pixels 101a and to read a signal from each of the pixels 101a.

The column processing section 103 performs predetermined signal processing on a pixel signal output, through the vertical signal line 107, from a predetermined pixel 101a in the sharing pixel unit section in a selected row in each of columns of the sharing pixel unit sections of the pixel section 101, and temporarily holds the signal-processed pixel signal.

More specifically, the column processing section 103 may perform, for example, various kinds of processing such as AD (Analog to Digital) conversion processing, and CDS (Correlated Double Sampling) processing on the pixel signal output to the vertical signal line 107. In a case where the CDS processing is performed in the column processing section 103, for example, fixed pattern noise inherent to a pixel caused by reset noise, variation in a threshold value of an amplification transistor, and the like is allowed to be removed.

The horizontal drive section 104 may be configured of, for example, circuit devices such as a shift register and an address decoder, and sequentially selects and scans unit circuits (not illustrated) arranged for respective columns of the column processing section 103. Pixel signals subjected to signal processing in respective unit circuits of the column processing section 103 are sequentially output to the signal processing section 108 by selection and scanning in the horizontal drive section 104.

The system control section 105 may be configured of, for example, a timing generator that generates timing signals for various operations of the CMOS image sensor 100, or the like. Then, various timing signals generated in the system control section 105 are supplied to the vertical drive section 102, the column processing section 103, and the horizontal drive section 104, and driving of respective components is controlled, based on these timing signals.

The signal processing section 108 may perform, for example, various kinds of signal processing such as addition processing on a pixel signal output from the column processing section 103. Moreover, the data storage section 109 temporarily holds data necessary to perform predetermined signal processing in the signal processing section 108.

[Arrangement of Pixels]

Figure 3:
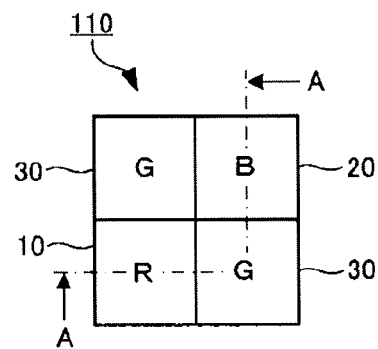
FIG. 3 is a diagram illustrating an arrangement of the red pixel, the blue pixel, and the green pixel in the CMOS image sensor according to the first embodiment.

FIG. 3 illustrates the arrangement of pixels and a schematic configuration of the sharing pixel unit section in the CMOS image sensor 100 according to this embodiment. In this embodiment, as illustrated in FIG. 3, an example in which red pixels 10, blue pixels 20, and green pixels 30 are arranged in a Bayer arrangement will be described. It is to be noted that the present disclosure is not limited thereto, and the technology of the present disclosure is also applicable to any other arbitrary pixel arrangements, and similar effects are obtainable.

Moreover, in this embodiment, an example in which one red pixel 10, one blue pixel 20, and two green pixels 30 (four pixels in total) that are located adjacent to one another configures one sharing pixel unit section 110 in the Bayer arrangement illustrated in FIG. 3 will be described. In other words, in this embodiment, pixel transistors other than the transfer transistor and an FD region section are shared among four pixels, i.e., one red pixel 10, one blue pixel 20, and two green pixels 30. It is to be noted that the arrangement of the pixels and the number of sharing pixels are not limited to the example illustrated in FIG. 3, and may be modified as necessary in consideration of uses and necessary conditions such as image pickup characteristics.

[Equivalent Circuit of Sharing Pixel Unit Section]

Figure 4:
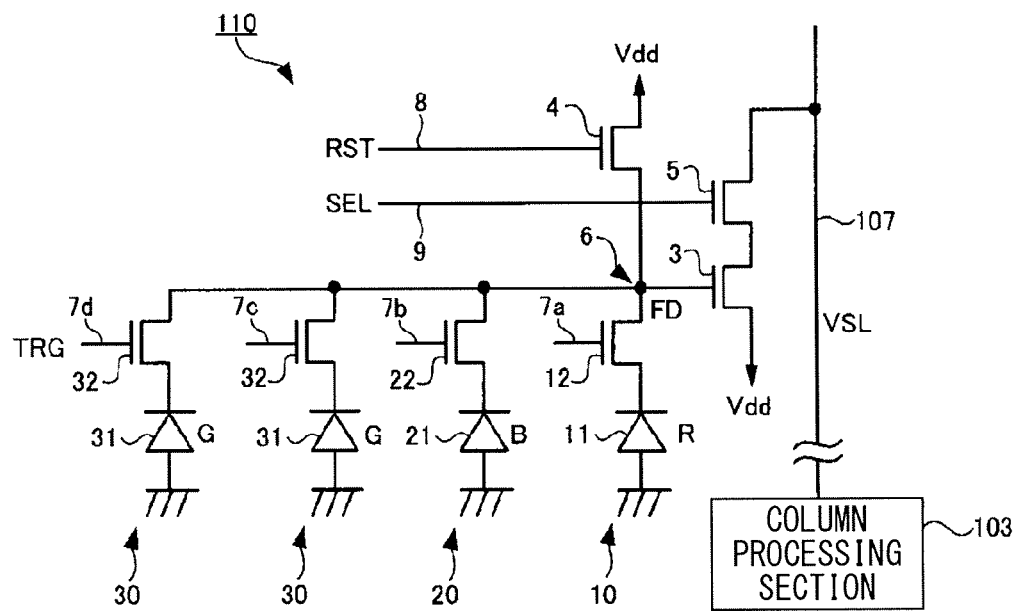
FIG. 4 is an equivalent circuit diagram of a sharing pixel unit section in the CMOS image sensor according to the first embodiment.

FIG. 4 illustrates an equivalent circuit of the sharing pixel unit section 110.

As illustrated in FIG. 4, the sharing pixel unit section 110 includes a red charge storage section 11 and a red transfer transistor 12 of the red pixel 10, and a blue charge storage section 21 and a blue transfer transistor 22 of the blue pixel 20. The sharing pixel unit section 110 further includes a green charge storage section 31 and a green transfer transistor 32 of each of the green pixels 30. The sharing pixel unit section 110 further includes an amplification transistor 3, a reset transistor 4, a selection transistor 5, and an FD region section 6 that are shared among the four pixels.

Transfer wiring lines (7a to 7d) for driving of the transfer transistor are provided to the respective pixels in the sharing pixel unit section 110. Moreover, a reset wiring line 8 and an address wiring line 9 that drive the reset transistor 4 and the selection transistor 5, respectively, shared among the four pixels are provided in the sharing pixel unit section 110. Further, the vertical signal line 107 where a pixel signal (a voltage signal) corresponding to a signal charge of each pixel is output is provided in the sharing pixel unit section 110.

Figure 5:
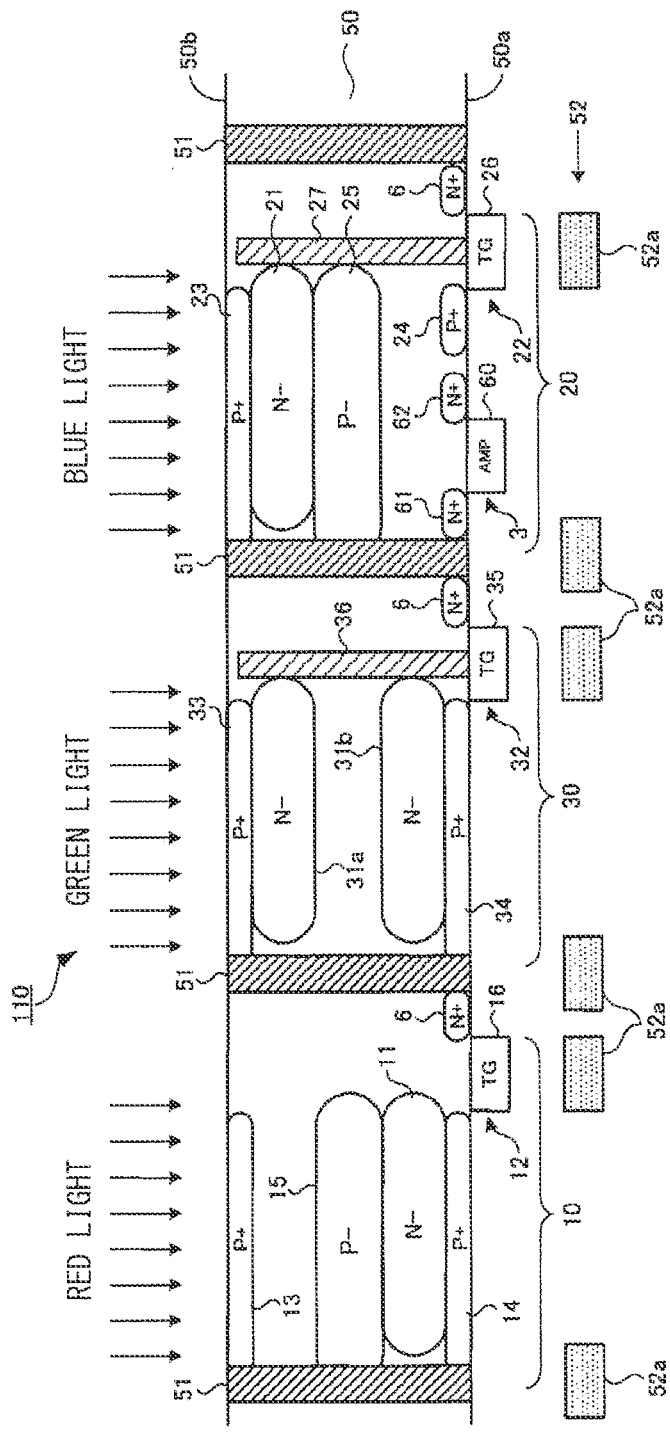
FIG. 5 is a schematic sectional view of the sharing pixel unit section in the CMOS image sensor according to the first embodiment.

The charge storage section (PD) in each pixel holds a charge (electrons in this case) generated by performing photoelectric conversion on an incident light component with a corresponding wavelength in the silicon substrate. In this embodiment, as illustrated in FIG. 5 that will be described later, each charge storage section is configured of an impurity region of N-type carrier polarity. Moreover, in this embodiment, each pixel transistor is configured of a MOS transistor of N-type carrier polarity. An anode of each charge storage section is grounded, and a cathode of each charge storage section is connected to a source of a corresponding transfer transistor.

Moreover, respective gates of the transfer transistors (2a to 2c) of the respective pixels are connected to respective corresponding transfer wiring lines (7a to 7d). Further, each transfer transistor is provided between a corresponding charge storage section and the FD region section 6, and a drain of each transfer transistor is connected to the FD region section 6.

Each transfer transistor is turned to an ON state when a high-level transfer signal (TRG: voltage signal) is input from the vertical drive section 102 to the gate thereof through a corresponding transfer wiring line, and transfers, to the FD region section 6, a charge (electrons) subjected to photoelectric conversion in a corresponding charge storage section. It is to be noted that the charge transferred to the FD region section 6 is converted into a voltage (a potential) in the FD region section 6.

A gate of the amplification transistor 3 is connected to the FD region section 6. Moreover, a drain of the amplification transistor 3 is connected to a supply terminal of a power supply voltage Vdd, and a source of the amplification transistor 3 is connected to the vertical signal line 107 through the selection transistor 5. The amplification transistor 3 amplifies the potential of the FD region section 6, and outputs an amplification signal thereof as a pixel signal (a light accumulation signal) to the selection transistor 5.

The reset transistor 4 is provided between the supply terminal of the power supply voltage Vdd and the FD region section 6. The reset transistor 4 is turned to an ON state when a high-level reset signal (RST) is input from the vertical drive section 102 to a gate thereof through the reset wiring line 8, and resets the potential of the FD region section 6 to the power supply voltage Vdd.

Moreover, the selection transistor 5 is provided between the amplification transistor 3 and the vertical signal line 107. The selection transistor 5 is turned to an ON state when a high-level address signal (SEL) is input from the vertical drive section 102 to a gate thereof through the address wiring line 9, and outputs, to the vertical signal line 107, a pixel signal (a voltage signal) amplified by the amplification transistor 3. It is to be noted that the pixel signal of each pixel output to the vertical signal line 107 is transferred to the column processing section 103.

[Internal Configuration of Sharing Pixel Unit Section]

FIG. 5 illustrates internal configurations of the sharing pixel unit section 110 and respective pixels of the pixel section 101 in the CMOS image sensor 100 according to this embodiment. It is to be noted that FIG. 5 is an A-A sectional view in FIG. 3, and is a schematic sectional view of a silicon substrate 50 (hereinafter simply referred to as "substrate 50") in which respective pixels are formed.

(1) Entire Configuration of Sharing Pixel Unit Section

In this embodiment, as illustrated in FIG. 5, the red pixel 10, the blue pixel 20, and the green pixel 30 are arranged adjacent to one another in an in-plane direction of the substrate 50, and a device isolation region 51 is provided between every adjacent two of the pixels. In this embodiment, respective pixels are isolated from one another by the device isolation region 51.

Moreover, in this embodiment, as illustrated in FIG. 5, a wiring layer 52 in which a wiring line 52a is formed is provided on a surface (a front surface 50a) opposite to a light incident surface (a back surface 50b) of the substrate 50 with an interlayer insulating film (not illustrated) in between. It is to be noted that, although not illustrated in FIG. 5, a color filter is provided on the back surface 50b of the substrate 50, and red light, blue light, and green light having passed through the color filter is incident on the red pixel 10, the blue pixel 20, and the green pixel 30, respectively.

Further, as illustrated in FIG. 5, the FD region section 6 configured of an impurity layer of N-type carrier polarity is so formed as to be embedded in a predetermined region of the front surface 50a of the substrate 50. In an example illustrated in FIG. 5, the FD region section 6 is provided to each pixel, and the FD region section 6 is provided in a region between the transfer transistor of each pixel and the device isolation region 51 disposed in a region adjacent to that transfer transistor. Furthermore, although not illustrated in FIG. 5, in this embodiment, the FD region section 6 is shared among four pixels; therefore, the impurity layers of N-type carrier polarity configuring to the FD region sections 6 provided to respective pixels are connected to one another. It is to be noted that an impurity concentration of the FD region section 6 may be, for example, about $1 \times 10^{20}$ cm$^{-3}$.

Moreover, in this embodiment, the amplification transistor 3, the reset transistor 4, and the selection transistor 5 shared among four pixels are formed in a neighborhood of the front surface 50a of the substrate 50 in a formation region of the blue pixel 20 in which a photoelectric conversion depth is shallowest as viewed from a light incident side. Even though the shared pixel transistors are arranged in the formation region of the blue pixel 20 in such a manner, a photoelectric conversion depth position of the blue pixel 20 is located at a position departed from the neighborhood where the pixel transistors are formed of the front surface 50a of the substrate 50; therefore, a photoelectric conversion action in the blue pixel 20 is not adversely affected. It is to be noted that, in the example illustrated in FIG. 5, for convenience of description, only the amplification transistor 3 of the three shared pixel transistors is illustrated in the blue pixel 20.

As illustrated in FIG. 5, the amplification transistor 3 is configured of an amplification gate 60, a source 61, and a drain 62. Both the source 61 and the drain 62 of the amplification transistor 3 are configured of impurity layers of N-type carrier polarity, and each of the impurity layers is so formed as to be embedded in a predetermined region of the front surface 50a of the substrate 50 in the formation region of the blue pixel 20. Then, the amplification gate 60 of the amplification transistor 3 is formed in a region between the source 61 and the drain 62 on the front surface 50a of the substrate 50.

(2) Configuration of Red Pixel

As illustrated in FIG. 5, the red pixel 10 includes the red charge storage section 11, two P+ layers 13 and 14, and a P− layer 15 that are so formed as to be embedded inside the substrate 50, and the red transfer transistor 12.

Both the two P+ layers 13 and 14 are configured of impurity layers of P-type carrier polarity, and may function as pinning layers to achieve a reduction in a dark current, a reduction in white spots, and the like. One P+ layer 13 is so provided as to be embedded in the back surface 50b of the substrate 50, and the other P+ layer 14 is so provided as to be embedded in the front surface 50a of the substrate 50. It is to be noted that an impurity concentration of each P+ layer may be, for example, about $1 \times 10^{20}$ cm$^{-3}$.

The red charge storage section 11 is configured of an impurity layer of N-type carrier polarity, and electrons (electrons in an amount corresponding to a light amount of red light) generated by photoelectric conversion is stored in the red charge storage section 11. A photoelectric conversion depth with respect to red light in the substrate 50 is deeper than those with respect to blue light and green light. Therefore, in this embodiment, the red charge storage section 11 is provided in a region on a side closer to the front surface 50a (at a deep position as viewed from a red light incident surface (the back surface 50b)) in the substrate 50, and in the example illustrated in FIG. 5, the red charge storage section 11 is provided in a region on a light incident side of the P+ layer 14. In other words, in this embodiment, a PD with a HAD type configuration (P+/N− junction type) is configured of the red charge storage section 11 and the P+ layer 14. It is to be noted that an impurity concentration of the red charge storage section 11 may be, for example, about $1 \times 10^{17}$ cm$^{-3}$ to about $1 \times 10^{18}$ cm$^{-3}$.

The P− layer 15 is configured of an impurity layer of P-type carrier polarity, and is provided in a region on a light incident side of the red charge storage section 11 in the example illustrated in FIG. 5. The P− layer 15 is provided to inhibit the entry of electrons subjected to photoelectric conversion at a position shallower than the region of the red charge storage section 11 as viewed from the red light incident side into the red charge storage section 11. Therefore, in a case where the P− layer 15 is provided as with this embodiment, color mixture is preventable. It is to be noted that an impurity concentration of the P− layer 15 may be, for example, about $1 \times 10^{17}$ cm$^{-3}$ to about $1 \times 10^{18}$ cm$^{3}$.

The red transfer transistor 12 transfers a charge stored in the red charge storage section 11 to the FD region section 6. A red transfer gate film 16 of the red transfer transistor 12 is formed in a region between the P+ layer 14 and the FD region section 6 on the front surface 50a of the substrate 50. It is to be noted that, although not illustrated in FIG. 5, a gate insulating film configured of, for example, an SiO$_2$ film or the like is provided between the red transfer transistor 12 (a red transfer gate film 16) and the substrate 50.

(3) Configuration of Blue Pixel

As illustrated in FIG. 5, the blue pixel 20 includes the blue charge storage section 21, two P+ layers 23 and 24, and P− layer 25 that are so formed as to be embedded inside the substrate 50, and the blue transfer transistor 22.

Both the two P+ layers 23 and 24 are configured of impurity layers of P-type carrier polarity, and may function as pinning layers to achieve a reduction in a dark current, a reduction in white spots, and the like. One P+ layer 23 is so provided as to be embedded in the back surface 50b of the substrate 50, the other P+ layer 24 is so provided as to be embedded in a region of the surface 50a of the substrate 50 as well as a region that does not overlap a formation region of the amplification transistor 3. It is to be noted that an impurity concentration of each P+ layer may be, for example, about $1\times1020$ cm$^3$.

The blue charge storage section 21 is configured of an impurity layer of N-type carrier polarity, and electrons (electrons in an amount corresponding to a light amount of blue light) generated by photoelectric conversion is stored in the blue charge storage section 21. A photoelectric conversion depth with respect to blue light in the substrate 50 is shallower than those with respect to red light and green light. Therefore, in this embodiment, the blue charge storage section 21 is provided in a region on a side closer to the back surface 50b (at a shallow position as viewed from a blue light incident surface (the back surface 50b)) in the substrate 50, and is provided in a region on a side opposite to the light incident side of the P+ layer 23 in the example illustrated in FIG. 5. In other words, in this embodiment, a PD with a HAD type configuration is configured of the blue charge storage section 21 and the P+ layer 23. It is to be noted that, in this embodiment, the configuration (for example, the impurity concentration, a width in a depth direction, and the like) of the blue charge storage section 21 is similar to that of the red charge storage section 11, and a saturation charge amount (the saturation signal amount) of the blue charge storage section 21 is similar to that of the red charge storage section 11.

The P− layer 25 is configured of an impurity layer of P-type carrier polarity, and is provided in a region on a side opposite to a light incident side of the blue charge storage section 21 in the example illustrated in FIG. 5. The P− layer 25 is provided to inhibit the entry of electrons subjected to photoelectric conversion at a position deeper than the region of the blue charge storage section 21 as viewed from the blue light incident side into the blue charge storage section 21. Therefore, in a case where the P− layer 25 is provided as with this embodiment, color mixture is preventable. It is to be noted that an impurity concentration of the P− layer 25 may be, for example, about $1\times1017$ cm$^{-3}$ to about $1\times1018$ cm$^{-3}$.

The blue transfer transistor 22 transfers a charge stored in the blue charge storage section 21 to the FD region section 6. It is to be noted that, in this embodiment, a transfer gate of the blue transfer transistor 22 is configured of a vertical transfer gate. More specifically, as illustrated in FIG. 5, the transfer gate of the blue transfer transistor 22 is configured of a blue transfer gate film 26 formed on the front surface 50a of the substrate 50 and a columnar blue vertical gate electrode section 27 embedded inside the substrate 50.

The blue transfer gate film 26 is formed in a region between the P+ layer 24 and the FD region section 6 on the front surface 50a of the substrate 50. The blue vertical gate electrode section 27 is so formed as to extend from the blue transfer gate film 26 (the front surface 50a) to a formation region of the blue charge storage section 21 along a thickness (depth) direction of the substrate 50.

It is to be noted that, in this embodiment, the blue charge storage section 21 is formed at a deep position as viewed from the front surface 50a of the substrate 50; however, when the transfer gate of the blue transfer transistor 22 is configured of a vertical transfer gate, electrons stored in the blue charge storage section 21 are easily transferred. Moreover, although not illustrated in FIG. 5, a gate insulating film configured of, for example, an SiO$_2$ film or the like is provided between the blue transfer transistor 22 (the blue transfer gate film 26 and the blue vertical gate electrode section 27) and the substrate 50.

(4) Configuration of Green Pixel

As illustrated in FIG. 5, the green pixel 30 includes a first green charge storage section 31a, a second green charge storage section 31b, and two P+ layers 33 and 34 that are so formed as to be embedded inside the substrate 50, and the green transfer transistor 32. In other words, in this embodiment, the green charge storage section 31 represented by an equivalent circuit in FIG. 4 is configured of two green charge storage sections (the first green charge storage section 31a and the second green charge storage section 31b).

The two P+ layers 33 and 34 are configured of impurity layers of P-type carrier polarity, and may function as, for example, pinning layers to achieve a reduction in a dark current, a reduction in white spots, and the like. One P+ layer 33 is so provided as to be embedded in the back surface 50b of the substrate 50, and the other P+ layer 34 is so provided as to be embedded in the front surface 50a of the substrate 50. It is to be noted that an impurity concentration of each P+ layer may be, for example, about $1\times1020$ cm$^{-3}$.

The first green charge storage section 31a is configured of an impurity layer of N-type carrier polarity, and electrons generated by photoelectric conversion are stored in the first green charge storage section 31a. The first green charge storage section 31a is provided in a region on a side closer to the back surface 50b, i.e., at a shallow position as viewed from a green light incident surface (the back surface 50b) in the substrate 50. The first green charge storage section 31a is provided in a region on a side opposite to the light incident side of the P+ layer 33 in the example illustrated in FIG. 5. In other words in this embodiment, a PD with a HAD type configuration is configured of the first green charge storage section 31a and the P+ layer 33.

It is to be noted that, in this embodiment, the configuration (for example, an impurity concentration, a width in a depth direction, and the like) of the first green charge storage section 31a is similar to that of the blue charge storage section 21, and a saturation charge amount (saturation charge signal amount) of the first green charge storage section 31a is similar to that of the blue charge storage section 21. Moreover, in this embodiment, a formation position (depth) in the depth (thickness) direction of the substrate 50 of the first green charge storage section 31a is similar to that of the blue charge storage section 21. When the first green charge storage section 31a has such a configuration, the first green charge storage section 31a and the blue charge storage section 21 are allowed to be fabricated concurrently.

The second green charge storage section 31b is configured of an impurity layer of N-type carrier polarity as with the first green charge storage section 31a, and electrons generated by photoelectric conversion are stored in the second green charge storage section 31b. The second green charge storage section 31b is provided in a region on a side closer to the front surface 50a, i.e., at a deep position as viewed from the green light incident surface (the back surface 50b) in the substrate 50. The second green charge storage section 31b is provided in a region on a light incident side of the P+ layer 34 in the example illustrated in FIG. 5. In other words, in this embodiment, a PD with a HAD type configuration is configured of the second green charge storage section 31b and the P+ layer 34.

It is to be noted that, in this embodiment, the configuration (for example, an impurity concentration, a width in a depth direction, and the like) of the second green charge storage section 31b is similar to that of the red charge storage section 11, and a saturation charge amount (saturation charge signal amount) of the second green charge storage section 31b is similar to that of the red charge storage section 11. In other words, in this embodiment, respective charge storage sections are so configured as to allow the saturation charge amounts of the red charge storage section 11, the blue charge storage section 21, the first green charge storage section 31a, and the second green charge storage section 31b to be equal to one another. Moreover, in this embodiment, a formation position (depth) of the second green charge storage section 31b in the depth (thickness) direction of the substrate 50 is similar to that of the red charge storage section 11. When the second green charge storage section 31b has such a configuration, the second green charge storage section 31b and the red charge storage section 11 are allowed to be fabricated concurrently.

The green transfer transistor 32 transfers a charge stored in the green charge storage section 31 to the FD region section 6. It is to be noted that, in this embodiment, the transfer gate of the green transfer transistor 32 is configured of a vertical transfer gate. More specifically, as illustrated in FIG. 5, the transfer gate of the green transfer transistor 32 is configured of a green transfer gate film 35 formed on the front surface 50a of the substrate 50, and a columnar green vertical gate electrode section 36 embedded inside the substrate 50.

The green transfer gate film 35 is formed in a region between the P+ layer 34 and the FD region section 6 on the front surface 50a of the substrate 50. The green vertical gate electrode section 36 is so formed as to extend from the green transfer gate film 35 (the front surface 50a) to a formation region of the first green charge storage section 31a along the thickness (depth) direction of the substrate 50.

It is to be noted that, in this embodiment, the first green charge storage section 31a is formed at a deep position as viewed from the front surface 50a of the substrate 50; however, when the transfer gate of the green transfer transistor 32 is configured of a vertical transfer gate, a charge stored in the first green charge storage section 31a is easily transferred. Moreover, although not illustrated in FIG. 5, a gate insulating film configured of, for example, an SiO2 film or the like is provided between the green transfer transistor 32 (the green transfer gate film 35 and the green vertical gate electrode section 36) and the substrate 50.

[Various Effects]

Figure 6:
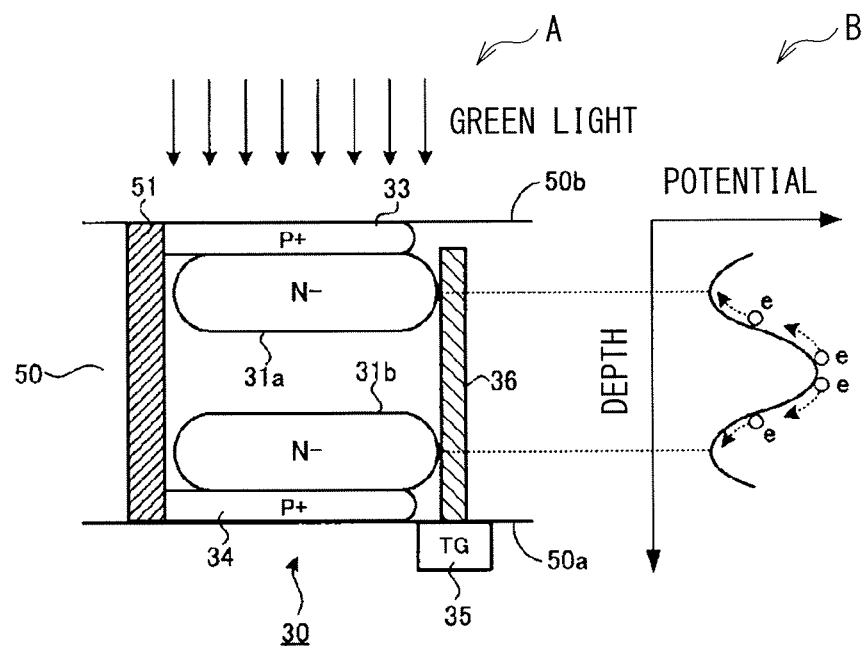
FIG. 6 is a diagram for describing a photoelectric conversion operation in the green pixel.

A photoelectric conversion operation in the green pixel 30 with the above-described configuration will be briefly described below referring to FIG. 6. It is to be noted that an A portion in FIG. 6 is a diagram illustrating a configuration in the substrate 50 of the green pixel 30, and a B portion in FIG. 6 is a diagram illustrating a potential distribution in the depth direction of the substrate 50 of the green pixel 30.

The photoelectric conversion depth for green light is shallower than that for red light and deeper than that for blue light as viewed from the light incident surface (back surface 50a) side of the substrate 50. Therefore, in the depth direction of the substrate 50, photoelectric conversion on green light is efficiently performed at a position about midway between the red charge storage section 11 and the blue charge storage section 21.

On the other hand, in this embodiment, the first green charge storage section 31a and the second green charge storage section 31b are provided at a shallow position (around the back surface 50b) and a deep position (around the front surface 50a), respectively, in the substrate 50 as viewed from the green light incident side. In this case, as illustrated in the B portion in FIG. 6, in the substrate 50, a potential at a midway position between two green charge storage sections is higher than a potential of each green charge storage section.

When green light is incident under this condition, photoelectric conversion on the green light is performed mainly in a region about midway between the two green charge storage sections, and a charge (electrons e) subjected to the photoelectric conversion enters into one of the regions of the first green charge storage section 31a and the second green charge storage section 31b with a lower potential. In other words, in this embodiment, in green light, a charge subjected to photoelectric conversion is distributed and stored in the first green charge storage section 31a or the second green charge storage section 31b.

It is to be noted that, in the configuration of the green pixel 30 in this embodiment, as described above, the first green charge storage section 31a and the second green charge storage section 31b have the same configurations as those of the blue charge storage section 21 and the red charge storage section 11, respectively. Therefore, in this embodiment, a charge amount (saturation charge amount) capable of being stored in the entire green pixel 30 is about twice as large as each of charge amounts capable of being stored in the red pixel 10 and the blue pixel 20. In this case, even if exposure (storing of a charge) is performed until a time (a time t2 in FIG. 1) when the charge amount reaches the saturation charge amount of the red pixel 10 and the blue pixel 20, a charge does not flow in the green pixel 30. In other words, in this embodiment, full advantage is allowed to be taken of high sensitivity of the green pixel 30 without wasting the charge subjected to photoelectric conversion in the green pixel 30. Therefore, in this embodiment, favorable pixel characteristics are allowed to be obtained in respective pixels, based on sensitivity of pixels of respective colors.

Moreover, in the green pixel 30 with the above-described configuration, not only the charge at a midway position between the two green charge storage sections but also a charge subjected to photoelectric conversion in regions close to the formation regions of the first green charge storage section 31a and the second green charge storage section 31b are stored in respective green charge storage sections. In this case, light of a green light wavelength component overlapping a red light wavelength region and light of a green light wavelength component overlapping a blue light wavelength region are also subjected to photoelectric conversion, and charges corresponding to these wavelength components are stored in the respective green charge storage sections. In other words, in this embodiment, information of the green light wavelength component overlapping the red light wavelength region and the green light wavelength component overlapping the blue light wavelength region is allowed to be obtained, and color reproducibility is allowed to be improved.

Moreover, in the configuration according to this embodiment, the amplification transistor, the selection transistor, and the reset transistor shared among the red pixel 10, the blue pixel 20, and the green pixel 30 are arranged in the formation region of the blue pixel 20. Therefore, in this embodiment, in each of the red pixel 10 and the green pixel 30, a light reception area of the charge storage section is allowed to be increased, and an improvement in sensitivity of the red pixel 10 and the green pixel 30, and an increase in the saturation signal amount of the red pixel 10 and the green pixel 30 are allowed to be achieved. As a result, in each of the red pixel 10 and the green pixel 30, an SN ratio is allowed to be increased, and an improvement in image quality is allowed to be achieved.

Moreover, in the CMOS image sensor 100 according to this embodiment, as described above, the first green charge storage section 31a is allowed to be fabricated concurrently with the blue charge storage section 21, and the second green charge storage section 31b is allowed to be fabricated concurrently with the red charge storage section 11. Therefore, in this embodiment, the CMOS image sensor 100 is allowed to be fabricated more easily.

Further, in the configuration according to this embodiment, for example, the following advantages are allowed to be obtained, compared to the technology described in the above-described PTL 1.

As described above, in PTL 1, in a back side illumination solid-state image pickup unit, an amplification transistor, a selection transistor, and a reset transistor shared among a red pixel, a blue pixel, and a green pixel are selectively arranged in a formation region of the blue pixel. Moreover, in the solid-state image pickup unit in PTL 1, there is provided an impurity region section that has the same type (N type) carrier polarity as that of a charge storage section and extends from a part of a charge storage section of the blue pixel provided on a side closer to a back surface of a substrate to around a region beside a transfer gate provided on a front surface of the substrate. In PTL 1, a charge stored in the charge storage section of the blue pixel is transferred to the transfer transistor through the impurity region section to suppress generation of afterimages.

However, the configuration according to PTL 1 may cause the following issue in isolation performance between source-drain regions of various pixel transistors arranged in the formation region of the blue pixel and the charge storage section of the blue pixel, and an operation to transfer a charge stored in the blue pixel.

Conductivity types of the source-drain regions of various pixel transistors arranged in the formation region of the blue pixel are the same as that of the charge storage section of the blue pixel not only in PTL 1 but also in a typical configuration. Therefore, in the configuration in PTL 1, it is necessary to reliably isolate the charge storage section of the blue pixel from the source-drain regions of the various pixel transistors arranged in the formation region of the blue pixel.

However, in a case where the charge storage section of the blue pixel is brought close to a surface of the substrate to easily transfer a charge stored in the charge storage section of the blue pixel, it is difficult to secure isolation between the source-drain regions of the above-described various pixel transistors and the charge storage section. On the other hand, when the charge storage section of the pixel is kept away from the surface of the substrate to solve this issue, it is difficult to transfer the charge.

Further, in the configuration in PTL 1, when the pixel is miniaturized, a width (a width in a direction orthogonal to an extending direction) of an impurity region section that is so provided as to extend from around the surface of the substrate beside a transfer gate to the charge storage section of the blue pixel becomes narrower, and also in this case, it is difficult to transfer the charge. In other words, in the configuration in PTL 1, it is difficult to provide both favorable isolation performance between the source-drain regions of various pixel transistors arranged in the formation region of the blue pixel and the charge storage section of the blue pixel and favorable transfer performance of a charge stored in the blue pixel.

On the other hand, in this embodiment, the blue charge storage section 21 of the blue pixel 20 is formed in a region on a side closer to the back surface 50b in the substrate 50, and is allowed to be arranged separately from the source-drain regions of various pixel transistors arranged near the front surface 50a of the substrate 50. Moreover, in this embodiment, the P− layer 25 of a conductivity type (P type) opposite to that of the source-drain regions is provided in the region on the side closer to the front surface 50a of the substrate 50 of the blue charge storage section 21 of the blue pixel 20. Therefore, in this embodiment, the charge storage section 21 of the blue pixel 20 and the source-drain regions of various pixel transistors arranged near the front surface 50a of the substrate 50 of the blue pixel 20 are allowed to be securely isolated from each other.

Further, in this embodiment, a vertical transistor is used as the blue transfer transistor 22 of the blue pixel 20; therefore, the charge is easily transferred, and the above-described issue of charge transfer in PTL 1 is allowed to be solved. In other words, in the configuration according to this embodiment, both favorable isolation performance between the source-drain regions of various pixel transistors arranged in the formation region of the blue pixel 20 and the charge storage section of the blue pixel 20 and favorable transfer performance of a charge stored in the blue pixel 20 are allowed to be provided.

(2. Second Embodiment: Front Side Illumination Solid-State Image Pickup Unit)

In the above-described first embodiment, an example in which a layout technology of the charge storage section in the green pixel 30 in the present disclosure is applied to the back side illumination CMOS image sensor 100 is described; however, the present disclosure is not limited thereto. The above-described technology of the present disclosure may be applied to a front side illumination CMOS image sensor. In a second embodiment, such an example will be described.

Figure 7:
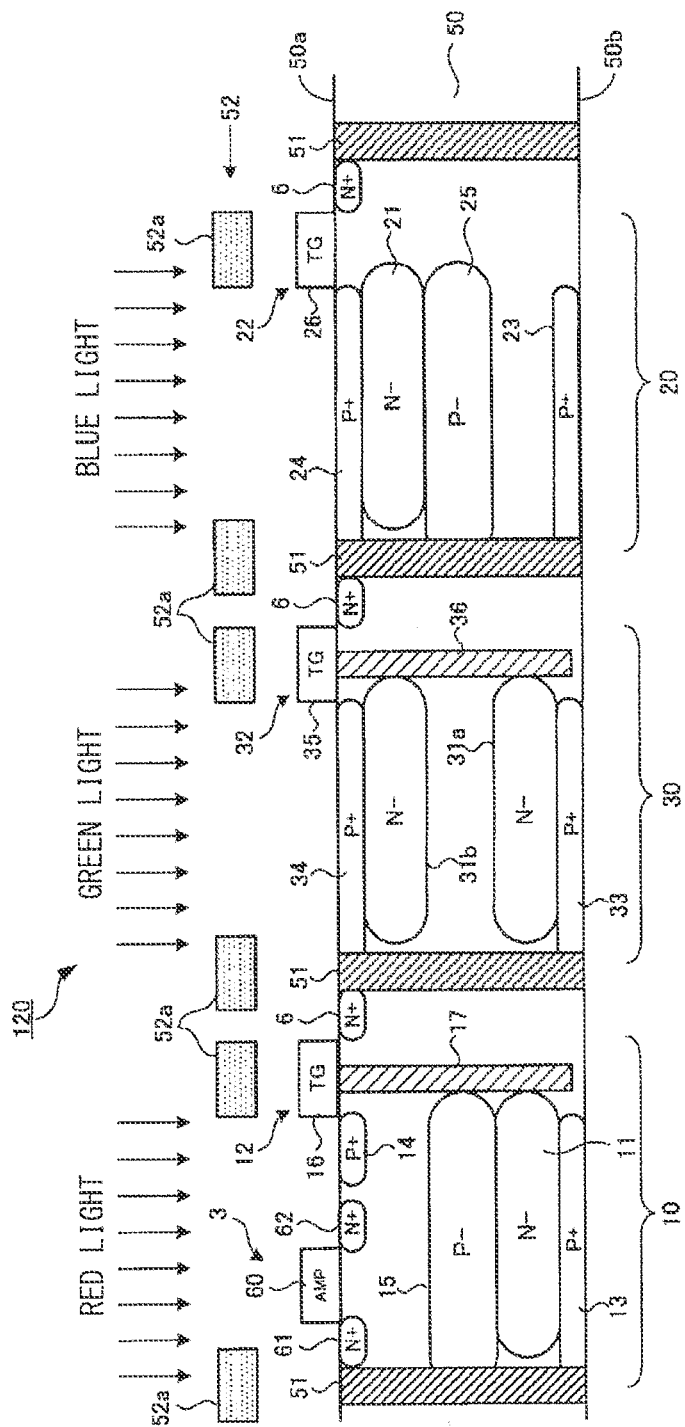
FIG. 7 is a schematic sectional view of a sharing pixel unit section according to a CMOS image sensor according to a second embodiment of the present disclosure.

FIG. 7 illustrates internal configurations of a sharing pixel unit section and respective pixels of a pixel section in a CMOS image sensor according to this embodiment. It is to be noted that FIG. 7 is an A-A sectional view in FIG. 3, and illustrates a schematic sectional view of a substrate in which respective pixel are formed.

Moreover, in a sharing pixel unit section 120 according to this embodiment illustrated in FIG. 7, like components are denoted by like numerals as of the sharing pixel unit section 110 according to the above-described first embodiment illustrated in FIG. 5. It is to be noted that an entire configuration of the CMOS image sensor, the arrangement of pixels, and an equivalent circuit of the pixel according to this embodiment are similar to those (refer to FIGS. 2 to 4) in the CMOS image sensor 100 according to the above-described first embodiment, and will not be further described below.

As can be seen from a comparison between FIG. 7 and FIG. 5, configurations of respective components configuring the sharing pixel unit section 120 of the CMOS image sensor according to this embodiment are basically similar to those of the components configuring the sharing pixel unit section 110 according to the above-described first embodiment. However, the CMOS image sensor according to this embodiment is a front side illumination type CMOS image sensor; therefore, a layout relationship of the respective components in this embodiment is different from that in the above-described first embodiment. Therefore, mainly the layout relationship of the respective components will be described below.

(1) Entire Configuration of Sharing Pixel Unit Section

In this embodiment, as illustrated in FIG. 7, the red pixel 10, the blue pixel 20, and the green pixel 30 are provided adjacent to one another in the in-plane direction of the substrate 50, and the device isolation region 51 is provided between every adjacent two of the pixels. Moreover, in this embodiment, the wiring layer 52 in which the wiring line 52a is formed is provided on the surface on a light incident side (the front surface 50a) of the substrate 50 with an interlayer insulating film (not illustrated) in between. Moreover, although not illustrated in FIG. 7, a color filter is provided on the light incident side of the wiring layer 52, and red light, blue light, and green light having passed through the color filter is incident on the red pixel 10, the blue pixel 20, and the green pixel 30, respectively.

Further, as with the above-described first embodiment, the FD region section 6 is so formed in the substrate 50 as to be embedded in a predetermined region of the front surface 50a of the substrate 50. In an example illustrated in FIG. 7, as with the above-described first embodiment, the FD region section 6 is provided to each pixel, and the FD region section 6 is provided in a region between the transfer transistor of each pixel and the device isolation region 51 disposed in a region adjacent to that transfer transistor. Furthermore, although not illustrated in FIG. 7, in this embodiment, the FD region section 6 is shared among four pixels; therefore, the FD region sections 6 provided to respective pixels are connected to one another.

Moreover, in this embodiment, the amplification transistor 3, the reset transistor 4, and the selection transistor 5 shared among four pixels are formed in a neighborhood of the front surface 50a of the substrate 50 in a formation region of the red pixel 10 in which a photoelectric conversion depth is deepest as viewed from the light incident side. Even though the shared pixel transistors are arranged in the formation region of the red pixel 10 in such a manner, a photoelectric conversion depth position of the red pixel 10 is located at a position departed from the neighborhood where the pixel transistors are formed of the front surface 50a of the substrate 50; therefore, a photoelectric conversion action in the red pixel 10 is not adversely affected. It is to be noted that, in the example illustrated in FIG. 7, for convenience of description, only the amplification transistor 3 of the three shared pixel transistors is illustrated in the red pixel 10.

As illustrated in FIG. 7, as with the above-described first embodiment, the amplification transistor 3 is configured of the amplification gate 60, the source 61, and the drain 62. Both the source 61 and the drain 62 of the amplification transistor 3 are so formed as to be embedded in a predetermined region of the front surface 50a of the substrate 50 in the formation region of the red pixel 10. Then, the amplification gate 60 of the amplification transistor 3 is formed in a region between the source 61 and the drain 62 on the front surface 50a of the substrate 50.

(2) Configuration of Red Pixel

As illustrated in FIG. 7, the red pixel 10 includes the red charge storage section 11, two P+ layers 13 and 14, and the P− layer 15 that are so formed as to be embedded inside the substrate 50, and the red transfer transistor 12.

The red charge storage section 11 is provided in a region on a side closer to the back surface 50b (at a deep position as viewed from the red light incident surface (the front surface 50a)) in the substrate 50, and in the example illustrated in FIG. 7, the red charge storage section 11 is provided in a region on the light incident side of the P+ layer 13. Moreover, one P+ layer 13 of the two P+ layers 13 and 14 is so provided as to be embedded in the back surface 50b of the substrate 50. The other P+ layer 14 is so provided as to be embedded in a region of the surface 50a of the substrate 50 as well as a region that does not overlap a formation region of the amplification transistor 3.

The P− layer 15 is provided in a region on the light incident side of the red charge storage section 11. Thus, the entry of electrons subjected to photoelectric conversion at a position shallower than the region of the red charge storage section 11 as viewed from the red light incident side into the red charge storage section 11 is allowed to be inhibited, and color mixture is preventable.

Moreover, in this embodiment, the transfer gate of the red transfer transistor 12 is configured of a vertical transfer gate. More specifically, as illustrated in FIG. 7, the transfer gate of the red transfer transistor 12 is configured of the red transfer gate film 16 formed on the front surface 50a of the substrate 50 and a columnar red vertical gate electrode section 17 embedded in the substrate 50.

The red transfer gate film 16 is formed in a region between the P+ layer 14 and the FD region section 6 on the surface 50a of the substrate 50. The red vertical gate electrode section 17 is so formed as to extend from the red transfer gate film 16 (the front surface 50a) to the formation region of the charge storage section 11 along the thickness direction (depth) direction of the substrate 50.

It is to be noted that, in this embodiment, the red charge storage section 11 is formed at a deep position as viewed from the front surface 50a of the substrate 50; however, when the transfer gate of the red transfer transistor 12 is configured of a vertical transfer gate, a charge stored in the red charge storage section 11 is easily transferred. It is to be noted that, although not illustrated in FIG. 7, a gate insulating film configured of, for example, an SiO2 film or the like is provided between the red transfer transistor 12 (the red transfer gate film 16 and the red vertical gate electrode section 17) and the substrate 50.

(3) Configuration of Blue Pixel

As illustrated in FIG. 7, the blue pixel 20 includes the blue charge storage section 21, two P+ layers 23 and 24, and the P− layer 25 that are so formed as to be embedded inside the substrate 50, and the blue transfer transistor 22.

The blue charge storage section 21 is provided in a region on a side closer to the front surface 50a (at a shallow position as viewed from the blue light incident surface (the front surface 50a)) in the substrate 50, and in the example illustrated in FIG. 7, the blue charge storage section 21 is provided in a region on a side opposite to the light incident side of the P+ layer 24. Moreover, one P+ layer 23 of the two P+ layers 23 and 24 is so provided as to be embedded in the back surface 50b of the substrate 50, and the other P+ layer 24 is so provided as to be embedded in the front surface 50a of the substrate 50.

In the example illustrated in FIG. 7, the P− layer 25 is provided in a region on a side opposite to the light incident side of the blue charge storage section 21. Therefore, the entry of electrons subjected to photoelectric conversion at a position deeper than the region of the blue charge storage section 21 as viewed from the blue light incident side into the blue charge storage section 21 is allowed to be inhibited, and color mixture is preventable.

Moreover, in this embodiment, unlike the above-described first embodiment, the transfer gate of the blue transfer transistor 22 is not a vertical transfer gate, and the blue transfer transistor 22 is configured of only the blue transfer gate film 26. It is to be noted that the blue transfer gate film 26 is formed in a region between the P+ layer 24 and the FD region section 6 on the front surface 50a of the substrate 50.

(4) Configuration of Green Pixel

As illustrated in FIG. 7, the green pixel 30 includes the first green charge storage section 31a, the second green charge storage section 31b, and two P+ layers 33 and 34 that are so formed as to be embedded inside the substrate 50, and the green transfer transistor 32.

The first green charge storage section 31a is provided in a region on the side closer to the back surface 50b, i.e., at a deep position as viewed from the green light incident surface (the front surface 50a) in the substrate 50, and is provided in a region on the light incident side of the P+ layer 33 in the example illustrated in FIG. 7. Moreover, the second green charge storage section 31b is provided in a region on the side closer the front surface 50a, i.e., at a shallow position as viewed from the green light incident surface (the front surface 50a) in the substrate 50, and is provided in a region on a side opposite to the light incident side of the P+ layer 34 in the example illustrated in FIG. 7.

One P+ layer 33 of the two P+ layers 33 and 34 is so provided as to be embedded in the back surface 50b of the substrate 50, and the other P+ layer 34 is so provided as to be embedded in the front surface 50a of the substrate 50.

Moreover, in this embodiment, as with the above-described first embodiment, the transfer gate of the green transfer transistor 32 is configured of a vertical transfer gate. More specifically, as illustrated in FIG. 7, the transfer gate of the green transfer transistor 32 is configured of the green transfer gate film 35 formed on the front surface 50a of the substrate 50 and the columnar green vertical gate electrode section 36 embedded inside the substrate 50.

The green transfer gate film 35 is formed in a region between the P+ layer 34 and the FD region section 6 on the front surface 50a of the substrate 50. The green vertical gate electrode section 36 is so formed as to extend from the green transfer gate film 35 (the front surface 50a) to the formation region of the first green charge storage section 31a along the thickness (depth) direction of the substrate 50.

It is to be noted that, in this embodiment, the first green charge storage section 31a is formed at a deep position as viewed from the front surface 50a of the substrate 50; however, when the transfer gate of the green transfer transistor 32 is configured of a vertical transfer gate, a charge stored in the first green charge storage section 31a is easily transferred.

As described above, in this embodiment, as with the above-described first embodiment, the respective green charge storage sections are provided to both respective regions on sides closer to the front surface 50a and the back surface 50b in the substrate 50 in the green pixel 30. Moreover, in this embodiment, in pixels (the red pixel 10 and the green pixel 30) provided with the charge storage section in a region on the side closer to the back surface 50b in the substrate 50, the transfer gate is configured of a vertical transfer gate. Therefore, even in this embodiment, effects similar to those in the above-described first embodiment are allowed to be obtained.

(3. Various Modification Examples)

The configuration of the solid-state image pickup unit according to the present disclosure is not limited to the configurations described in the above-described various embodiments, and, for example, the following various modification examples may be considered.

[Modification Example 1]

In the above-described various embodiments, an example in which two green charge storage sections are provided along the thickness direction of the substrate 50 in the green pixel 30 is described; however, the present disclosure is not limited thereto. Three or more green charge storage sections may be provided along the thickness direction of the substrate 50 in the green pixel 30, and even in this case, effects similar to those in the above-described various embodiments are allowed to be obtained.

[Modification Example 2]

In the above-described various embodiments, an example in which the red charge storage section 11, the blue charge storage section 21, the first green charge storage section 31a, and the second green charge storage section 31b have the same configuration (the same saturation charge amount) as one another is described; however, the present disclosure is not limited thereto. In the present disclosure, the configurations (saturation charge amounts) of the charge storage sections of respective colors may be different from one another.

[Modification Example 3]

In the above-described various embodiments, an example in which the above-described technology of the present disclosure is applied to the CMOS image sensor in which sharing among four pixels is done is described; however, the present disclosure is not limited thereto. The technology of the present disclosure may be applied to, for example, a CMOS image sensor in which sharing among a plurality of pixels, except for four pixels is done, or a CMOS image sensor not using the pixel sharing technology.

[Modification Example 4]

In the above-described various embodiments, an example in which the pixel transistors (the amplification transistor, the reset transistor, and the selection transistor) shared among pixels are arranged in a formation region of a predetermined pixel is described; however, the present disclosure is not limited thereto. The technology of the present disclosure is applicable to a CMOS image sensor in which the pixel transistors (the amplification transistor, the reset transistor, and the selection transistor) shared among the pixels are not collectively arranged in the formation region of a predetermined pixel. It is to be noted that, in a case where the pixel transistors shared among pixels are collectively arranged in the formation region of the predetermined pixel as with this embodiment, areas of photoelectric conversion regions (PD) of other sharing pixels are allowed to be increased. In this case, sensitivity of other sharing pixels is allowed to be improved, and the saturation signal amount is allowed to be increased.

[Modification Example 5]

In the above-described various embodiments, an example in which respective P+ layers configured to reduce a dark current and white spots are so provided in pixels of respective colors as to be embedded in the front surface 50a and the back surface 50b of the substrate 50 is described; however, the present disclosure is not limited thereto. Fixed charge layers of positive carrier polarity may be provided on both the front surface 50a and the back surface 50b of the substrate 50 without providing the P+ layers.

[Modification Example 6]

In the above-described various embodiments, an example in which the transfer gate of the transfer transistor in the pixel including the charge storage section in a region on the side closer to the back surface 50b of the substrate 50 is configured of a vertical transfer gate is described; however, the present disclosure is not limited thereto. In a case where an impurity region section connecting the charge storage section and a region beside a transfer gate film provided to the front surface 50a to each other is provided in a pixel including the charge storage section in a region on the side closer to the back surface 50b of the substrate 50, the transfer gate may not be configured of a vertical transfer gate. It is to be noted that, in a case where both isolation performance between the source-drain regions of various pixel transistors and the charge storage section and charge transfer performance in such a pixel are considered, the transfer gate of the transfer transistor may be preferably configured of a vertical transfer gate.

[Modification Example 7]

In the CMOS image sensors according to the above-described various embodiments, the conductivity type (N type or P type) of respective components in the substrate 50 may be reversed. More specifically, in the CMOS image sensors according to the above-described various embodiments, an example in which electrons are used as a signal charge is described; however, the charge storage section of each pixel may be configured of a P-type impurity layer, and holes may be used as the signal charge.

[Modification Example 8]

In the above-described various embodiments, the CMOS type solid-state image pickup unit is described as an example; however, the present disclosure is not limited thereto, and the above-described technology of the present disclosure is applicable to a CCD type solid-state image pickup unit, and similar effects are allowed to be obtained.

(4. Configuration of Electronic Apparatus (Application Example))

The solid-state image pickup unit according to the present disclosure is applicable to various kinds of electronic apparatuses. For example, the solid-state image pickup units described in the above-described various embodiments and various modification examples are applicable to electronic apparatuses including, for example, camera systems such as digital still cameras and digital video cameras, cellular phones having an image pickup function, and any other apparatuses having an image pickup function. As a configuration example of the electronic apparatus, a digital video camera will be described below.

Figure 8:
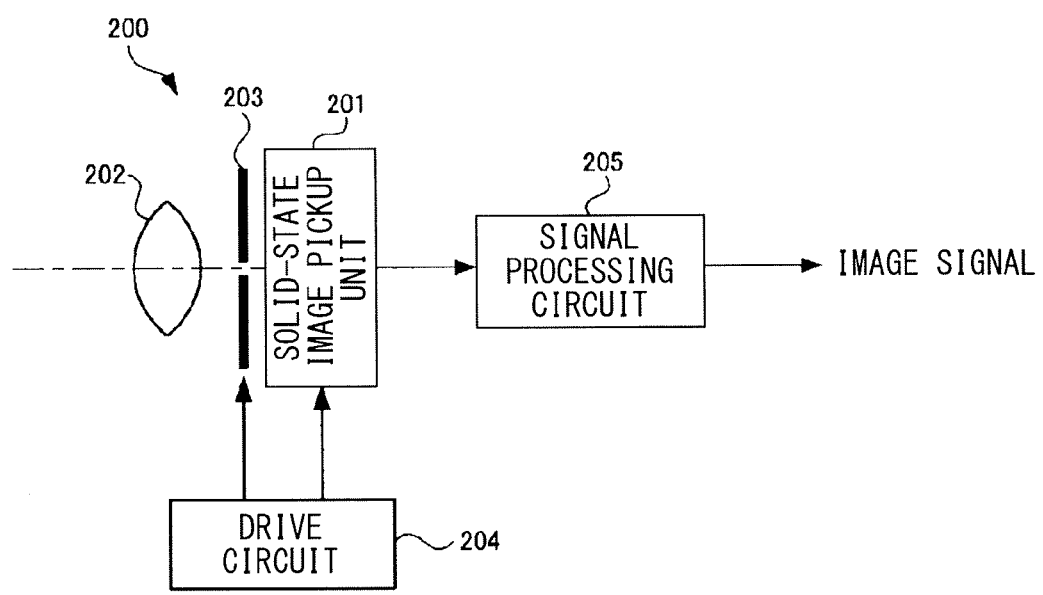
FIG. 8 is a diagram illustrating an example of an electronic apparatus to which a solid-state image pickup unit according to an embodiment of the present disclosure is applied.

FIG. 8 illustrates a schematic configuration of a digital video camera (hereinafter simply referred to as "camera") to which the solid-state image pickup unit according to the present disclosure is applied.

A camera 200 includes a solid-state image pickup unit 201, an optical system 202 that guides incident light to a light reception section (not illustrated) of the solid-state image pickup unit 201, a shutter unit 203 provided between the solid-state image pickup unit 201 and the optical system 202, and a drive circuit 204 that drives the solid-state image pickup unit 201. The camera 200 further includes a signal processing circuit 205 that processes an output signal from the solid-state image pickup unit 201.

The solid-state image pickup unit 201 may be configured of the solid-state image pickup unit described in any one of the above-described various embodiments and various modification examples. Configurations and functions of other respective components are as follows.

The optical system 202 (an optical lens) forms an image of image light (incident light) from a subject on an image pickup plane (not illustrated) of the solid-state image pickup unit 201. Therefore, a signal charge is stored in the solid-state image pickup unit 201 for a certain period. It is to be noted that the optical system 202 may be configured of an optical lens group including a plurality of optical lenses. Moreover, the shutter unit 203 controls a period (a light application period) in which light is incident on the solid-state image pickup unit 201 and a period (a light-shielding period) in which light incident on the solid-state image pickup unit 201 is shielded.

The drive circuit 204 supplies a drive signal to the solid-state image pickup unit 201 and the shutter unit 203. Then, the drive circuit 204 controls a signal transfer operation to the signal processing circuit 205 of the solid-state image pickup unit 201 and a shutter operation of the shutter unit 203 by the supplied drive signal. In other words, in this example, a signal transfer operation from the solid-state image pickup unit 201 to the signal processing circuit 205 is performed by a drive signal (a timing signal) supplied from the drive circuit 204.

The signal processing circuit 205 performs various kinds of signal processing on a signal transferred from the solid-state image pickup unit 201. A signal (image signal) subjected to various kinds of signal processing is stored in a storage medium (not illustrated) such as a memory, or is output to a monitor (not illustrated).

In the camera 200 in this example, the solid-state image pickup unit described in any one of the above-described various embodiments and various modification examples is used; therefore, high-sensitivity characteristics of the green pixel are allowed to be used effectively, and the saturation charge amount of the green pixel is allowed to be doubled to increase a dynamic range of the green pixel. Therefore, in the camera 200 in this example, an SN ratio is allowed to be improved, and image pickup with high image quality is possible.

It is to be noted the present disclosure may have the following configurations.

(1) A solid-state image pickup unit including:

a substrate;

a red pixel including a red charge storage section provided in the substrate, the red charge storage section that holds a charge obtained by performing photoelectric conversion on a light component with a red wavelength;

a blue pixel including a blue charge storage section provided in the substrate, the blue charge storage section that holds a charge obtained by performing photoelectric conversion on a light component with a blue wavelength; and a green pixel including a plurality of green charge storage sections that hold a charge obtained by performing photoelectric conversion on a light component with a green wavelength, the plurality of green charge storage sections being arranged in the substrate along a thickness direction of the substrate.

(2) The solid-state image pickup unit according to (1), in which a first green charge storage section is arranged in a region on one surface side in the substrate, and a second green charge storage section is arranged in a region on the other surface side in the substrate.

(3) The solid-state image pickup unit according to (1) or (2), further including a floating diffusion region section that converts a charge stored in the plurality of green charge storage sections into a voltage, in which the green pixel includes a transfer transistor that transfers the charge stored in the plurality of green charge storage sections to the floating diffusion region section of the green pixel, and a gate electrode of the transfer transistor includes a vertical gate electrode section formed to extend over an entire formation region of the plurality of green charge storage sections along the thickness direction of the substrate.

(4) The solid-state image pickup unit according to any one of (1) to (3), in which a saturation charge amount of the green pixel is larger than each of a saturation charge amount of the red pixel and a saturation charge amount of the blue pixel.

(5) The solid-state image pickup unit according to any one of (1) to (4), in which the red charge storage section of the red pixel is arranged in a region on a surface side opposite to a light incident surface side of the substrate in the substrate, and the blue charge storage section of the blue pixel is arranged in a region on the light incident surface side of the substrate in the substrate.

(6) The solid-state image pickup unit according to any one of (1) to (5), in which the red pixel includes an impurity region section provided in a region on a light incident side of the red charge storage section in the substrate, the impurity region section having a conductivity type opposite to a conductivity type of a carrier of the red charge storage section, and the blue pixel includes an impurity region section provided in a region on a side opposite to the light incident side of the blue charge storage section in the substrate, the impurity region section having a conductivity type opposite to a conductivity type of a carrier of the blue charge storage section.

(7) The solid-state image pickup unit according to any one of (1) to (6), further including:

a wiring layer formed on a surface on a side opposite to a light incident surface of the substrate; and a floating diffusion region section that converts a charge stored in the blue charge storage section into a voltage, in which the red charge storage section of the red pixel is arranged in a region on a surface side opposite to a light incident surface side of the substrate in the substrate, the blue charge storage section of the blue pixel is arranged in a region on the light incident surface side of the substrate in the substrate, and the blue pixel includes a transfer transistor that transfers the charge stored in the blue charge storage section to the floating diffusion region section of the blue pixel, and a gate electrode of the transfer transistor includes a vertical gate electrode section formed to extend from the surface on the side opposite to the light incident surface of the substrate to the blue photoelectric conversion region along the thickness direction of the substrate.

(8) The solid-state image pickup unit according to (7), further including a pixel transistor other than a transfer transistor, the pixel transistor being shared among the red pixel, the blue pixel, and the green pixel that are adjacent to one another in an in-plane direction of the substrate, in which the pixel transistor is arranged in a formation region of the blue pixel.

(9) The solid-state image pickup unit according to (7) or (8), further including a floating diffusion region section that converts a charge stored in the red charge storage section into a voltage, in which the red charge storage section of the red pixel is arranged in a region on the surface side opposite to the light incident surface side of the substrate, and the red pixel includes a transfer transistor that transfers the charge stored in the red charge storage section to the floating diffusion region section of the red pixel, and a gate electrode of the transfer transistor is a gate electrode film formed on the surface on the side opposite to the light incident surface of the substrate.

(10) The solid-state image pickup unit according to any one of (1) to (6), further including:

a wiring layer formed on a surface on a light incident side of the substrate; and a floating diffusion region section that converts a charge stored in the red charge storage section into a voltage, in which the blue charge storage section of the blue pixel is arranged in a region on a light incident surface side of the substrate in the substrate, the red charge storage section of the red pixel is arranged in a region on a surface side opposite to the light incident surface side of the substrate in the substrate, and the red pixel includes a transfer transistor that transfers the charge stored in the red charge storage section to a floating diffusion region section of the red pixel, and a gate electrode of the transfer transistor includes a vertical gate electrode section extending from a light incident surface of the substrate to the red photoelectric conversion region along a thickness direction of the substrate.

(11) The solid-state image pickup unit according to (10), further including a pixel transistor other than a transfer transistor, the pixel transistor being shared among the red pixel, the blue pixel, and the green pixel that are adjacent to one another in an in-plane direction of the substrate, in which the pixel transistor is arranged in a formation region of the red pixel.

(12) The solid-state image pickup unit according to (10) or (11), further including a floating diffusion region section that converts a charge stored in the blue charge storage section into a voltage, in which the blue charge storage section of the blue pixel is arranged in a region on the light incident surface side of the substrate, and the blue pixel includes a transfer transistor that transfers the charge stored in the blue charge storage section to a floating diffusion region section of the blue pixel, and a gate electrode of the transfer transistor is a gate electrode film formed on the light incident surface of the substrate.

(13) An electronic apparatus including:

a solid-state image pickup unit including a substrate, a red pixel, a blue pixel, and a green pixel, the red pixel including a red charge storage section that is provided in the substrate and holds a charge obtained by performing photoelectric conversion on a light component with a red wavelength, the a blue pixel including a blue charge storage section that is provided in the substrate and holds a charge obtained by performing photoelectric conversion on a light component with a blue wavelength, the green pixel including a plurality of green charge storage sections that hold a charge obtained by performing photoelectric conversion on a light component with a green wavelength, and the plurality of green charge storage sections being arranged in the substrate along a thickness direction of the substrate; and a signal processing circuit that performs predetermined processing on an output signal from the solid-state image pickup unit.

It should be understood by those skilled in the art that various modifications, combinations, sub-combinations, and alterations may occur depending on design requirements and other factors insofar as they are within the scope of the appended claims or the equivalents thereof.

What is claimed is:

1. An imaging apparatus, comprising:
a plurality of lens units;
a plurality of pixels, including:
red charge storage sections, wherein the red charge storage sections hold a charge obtained by photoelectric conversion on a light component with a red wavelength;
blue charge storage sections, wherein the blue charge storage sections hold a charge obtained by photoelectric conversion on a light component with a blue wavelength; and green charge storage sections, wherein the green charge storage sections hold a charge obtained by photoelectric conversion on a light component with a green wavelength, wherein the red charge storage sections, the blue charge storage sections, and the green charge storage sections are arranged in different positions respectively within the plurality of pixels, wherein a first vertical electrode of a transfer transistor for at least one of the blue charge storage sections is formed to extend from a surface on a side opposite to a light incident surface of the plurality of pixels to the blue charge storage sections, and a second vertical electrode of a transfer transistor for at least one of the green charge storage sections is formed to extend from the surface on the side opposite to the light incident surface of the plurality of pixels to the green charge storage sections, and wherein a saturation charge amount of the green charge storage sections is larger than each of a saturation charge amount of the red charge storage sections and the blue charge storage sections.

2. The imaging apparatus of claim 1, wherein a distance of at least some components of the red charge storage sections from the light incident surface of the plurality of pixels, a distance of at least some components of the blue charge storage sections from the light incident surface of the plurality of pixels, and a distance of at least some components of the green charge storage sections from the light incident surface of the plurality of pixels are different from one another.

3. The imaging apparatus of claim 1, wherein the red charge storage sections are arranged adjacent to the side opposite to the light incident surface of the plurality of pixels.

4. The imaging apparatus of claim 1, wherein the blue charge storage sections are arranged at a first distance from the light incident surface of the plurality of pixels, wherein the red charge storage sections are arranged at a second distance from the light incident surface of the plurality of pixels, and wherein the first distance is less than the second distance.

5. The imaging apparatus of claim 1, wherein the red charge storage sections are arranged farther from the light incident surface of the plurality of pixels than the blue charge storage sections and the green charge storage sections.

6. The imaging apparatus of claim 1, further comprising floating diffusion regions, wherein each floating diffusion region is shared by at least one of the red charge storage sections, at least one of the blue charge storage sections, and at least one of the green charge storage sections.

7. The imaging apparatus of claim 1, further comprising a wiring layer on a surface on the side opposite to the light incident surface of the plurality of pixels.

8. The imaging apparatus of claim 1, further comprising a plurality of pixel transistors other than the transfer transistor, wherein each of the plurality of pixel transistors is shared among at least one of the red charge storage sections, at least one of the blue charge storage sections, and at least one of the green charge storage sections.

9. An imaging device, comprising:
a substrate;
a plurality of pixels formed in the substrate, including:

red charge storage sections, wherein the red charge storage sections hold a charge obtained by photoelectric conversion on a light component with a red wavelength;

blue charge storage sections, wherein the blue charge storage sections hold a charge obtained by photoelectric conversion on a light component with a blue wavelength; and green charge storage sections, wherein the green charge storage sections hold a charge obtained by photoelectric conversion on a light component with a green wavelength; and a plurality of transfer transistors, wherein a first transfer transistor is provided for each of the blue charge storage sections, wherein the first transfer transistor includes a first vertical electrode that extends from a surface, that is opposite to a light incident surface of the substrate, to a respective blue charge storage section, wherein a second transfer transistor is provided for each of the green charge storage sections, wherein the second transfer transistor includes a second vertical electrode that extends from the surface, that is opposite to the light incident surface of the substrate, to a respective green charge storage section, and wherein a saturation charge amount of the green charge storage sections is larger than each of a saturation charge amount of the red charge storage sections and the blue charge storage sections.

10. The imaging device of claim 9, wherein a distance of at least some components of the red charge storage sections from the light incident surface, a distance of at least some components of the blue charge storage sections from the light incident surface, and a distance of at least some components of the green charge storage sections from the light incident surface are different from one another.

11. The imaging device of claim 9, wherein the red charge storage sections are arranged adjacent to the surface opposite to the light incident surface.

12. The imaging device of claim 9, wherein the blue charge storage sections are arranged at a first distance from the light incident surface, wherein the red charge storage sections are arranged at a second distance from the light incident surface, and wherein the first distance is less than the second distance.

13. The imaging device of claim 9, wherein the red charge storage sections are arranged farther from the light incident surface than the blue charge storage sections and the green charge storage sections.

14. The imaging device of claim 9, further comprising floating diffusion regions, wherein each floating diffusion region is shared by at least one of the red charge storage sections, at least one of the blue charge storage sections, and at least one of the green charge storage sections.

15. The imaging device of claim 9, further comprising a wiring layer on a surface on the side opposite to the light incident surface.

16. The imaging device of claim 9, further comprising a plurality of pixel transistors other than the plurality of transfer transistors, wherein each of the plurality of pixel transistors is shared among at least one of the red charge storage sections, at least one of the blue charge storage sections, and at least one of the green charge storage sections.

17. An electronic apparatus, comprising:
an optical system; and
an image pickup unit configured to receive incident light from the optical system, the image pickup unit including:
- a substrate;
- a plurality of pixels in the substrate, including:
  - red charge storage sections, wherein the red charge storage sections hold a charge obtained by photoelectric conversion on a light component with a red wavelength;
  - blue charge storage sections, wherein the blue charge storage sections hold a charge obtained by photoelectric conversion on a light component with a blue wavelength; and
  - green charge storage sections, wherein the green charge storage sections hold a charge obtained by photoelectric conversion on a light component with a green wavelength;
- a plurality of transfer transistors,
  - wherein a first transfer transistor is provided for each of the blue charge storage sections, wherein the first transfer transistor includes a first vertical electrode that extends from a surface of the substrate that is opposite to a light incident surface of the substrate to a respective blue charge storage section,
  - wherein a second transfer transistor is provided for each of the green charge storage sections, wherein the second transfer transistor includes a second vertical electrode that extends from the surface of the substrate that is opposite to the light incident surface of the substrate to a respective green charge storage section, and
  - wherein a saturation charge amount of the green charge storage sections is larger than each of a saturation charge amount of the red charge storage sections and the blue charge storage sections;
- a drive circuit, wherein the drive circuit is configured to drive the image pickup unit; and
- a signal processing circuit, wherein the signal processing circuit is configured to process an output signal from the image pickup unit.

18. The electronic apparatus of claim 17, wherein a dynamic range of the green charge storage sections is greater than a dynamic range of the red charge storage sections and the blue charge storage sections.

* * * * *